(12) United States Patent
Takaki et al.

(10) Patent No.: US 6,291,029 B1
(45) Date of Patent: Sep. 18, 2001

(54) PLASMA PROCESSING METHOD

(75) Inventors: Satoshi Takaki, Komae; Atsushi Yamagami; Nobuyuki Okamura, both of Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/368,497

(22) Filed: Aug. 5, 1999

Related U.S. Application Data

(62) Division of application No. 08/791,460, filed on Jan. 27, 1997, now Pat. No. 5,970,907.

(51) Int. Cl.[7] .................. C23C 16/00; B05D 3/06
(52) U.S. Cl. ............... 427/569; 427/571; 427/248.1; 427/294; 216/67; 216/71
(58) Field of Search ................. 427/294, 569, 427/571, 248.1; 438/170; 216/67, 71

(56) References Cited

U.S. PATENT DOCUMENTS

| | | | |
|---|---|---|---|
| 4,569,719 | * | 2/1986 | Coleman .............. 156/643 |
| 4,869,976 | * | 9/1989 | Tawada et al. ........... 427/39 |
| 5,055,421 | * | 10/1991 | Birkle et al. ........... 437/101 |
| 5,261,962 | * | 11/1993 | Hamamoto et al. ......... 118/723 |
| 5,277,751 | | 1/1994 | Ogle .................... 156/643 |
| 5,345,145 | | 9/1994 | Harafuji et al. ........ 315/111.41 |
| 5,531,834 | | 7/1996 | Ishizuka et al. ........ 118/723 I |
| 5,540,781 | * | 7/1996 | Yamagami et al. ........ 118/723 E |

OTHER PUBLICATIONS

H. Curtins, et al., "Influence of Plasma Excitation Frequency for a Si:H Thin Film Deposition", 1987, Plasma Chem. and Plasma Proc., vol. 7, pp. 267–273.

* cited by examiner

Primary Examiner—Shrive P. Beck
Assistant Examiner—Michael Barr
(74) Attorney, Agent, or Firm—Fitzpatrick, Cella, Harper & Scinto

(57) ABSTRACT

To improve the processing rate and uniformity in a plasma processing for a substrate having a relatively large area, a plasma processing apparatus includes a reaction vessel which has a portion made of a dielectric member, which accommodates a film formation substrate, and which can be evacuated, an evacuating means and a gas supply means for supplying a predetermined gas into the reaction vessel, a cathode electrode arranged in a position outside the reaction vessel where the cathode electrode opposes the film formation substrate accommodated in the reaction vessel via the dielectric member, and a high frequency power supply means (a matching circuit and a high frequency power supply) for supplying high frequency power of 30 MHz to 300 MHz to the cathode electrode. The high frequency power of 30 MHz to 300 MHz is supplied to the cathode electrode to generate a plasma between the dielectric member and the film formation substrate.

33 Claims, 5 Drawing Sheets

PLASMA PROCESSING METHOD

This application is a division of application Ser. No. 08/791,460, filed Jan. 27, 1997 now U.S. Pat. No. 5,970,907.

BACKGROUND OF THE INVENTION

1. Field of the Invention

The present invention relates to a plasma processing apparatus and a plasma processing method which can be suitably used as, e.g., a plasma CVD apparatus useful to semiconductor devices such as an electrophotographic photosensitive device, an image input line sensor, an image pickup device, and a photovoltaic device, a sputtering apparatus for forming, e.g., insulating films and metal interconnecting lines as semiconductor devices and optical elements, and an etching apparatus for semiconductor devices and the like.

2. Related Background Art

In the fabrication of semiconductors and the like devices, various plasma processing methods and apparatuses are used in accordance with the intended uses. For example, apparatuses and methods using the characteristics of plasma are used in, e.g., the formation of oxide films, nitride films, and amorphous silicon semiconductor films using a plasma CVD process, the formation of metal interconnecting layers using a sputtering process, and the fine processing techniques using etching. Also, as demands on the film quality and the performance are increasing recently, various improvements are being examined. In particular, a plasma process using high frequency power is extensively used because of the advantages that 1) discharge is stable, and 2) process can be applied to insulating materials such as an oxide film and a nitride film.

As one example of a plasma CVD apparatus generally used in the formation of deposited films, FIG. 1 shows a plasma processing apparatus as a film formation apparatus for an amorphous silicon film (to be referred to as an a-Si film hereinafter) for a cylindrical electrophotographic photosensitive body.

In FIG. 1, the apparatus comprises a reaction vessel 201 which can be evacuated. This reaction vessel 201 is connected to an evacuating means 209 for evacuating the vessel and a gas supply means 210 for supplying a gas into the vessel.

In the reaction vessel 201, a cylindrical cathode electrode 202 electrically insulated from the reaction vessel 201 by an insulating material 211 is arranged. Additionally, a cylindrical film formation substrate 203 is arranged as a counter electrode inside the cathode electrode 202. The film formation substrate 203 is held by a substrate holder 204 having a rotating mechanism driven by a motor 212. A heater 205 is positioned in the internal space of the film formation substrate 203. The film formation substrate 203 can be heated to a predetermined temperature from the inside by the heater 205 arranged in the internal space. The cathode electrode 202 is connected to a high frequency power supply 207 for discharge via a matching circuit 208.

Note that the oscillation frequency of a discharge high frequency power supply used in a plasma process such as plasma CVD is commonly 13.56 MHz. The oscillation frequency of the high frequency power supply 207 is also 13.56 MHz.

An a-Si film formation method using this plasma processing apparatus will be described below.

First, the reaction vessel 201 is evacuated to a high vacuum by the evacuating means 209. Thereafter, the gas supply means 210 supplies a source gas such as silane gas, disilane gas, methane gas, or ethane gas and a doping gas such as diborane gas to maintain the pressure at several tens of millitorr to a few torr. Subsequently, the high frequency power supply 207 supplies high frequency power of 13.56 MHz to the cathode electrode 202 to generate a plasma between the cathode electrode 202 and the film formation substrate 203, thereby decomposing the source gas. Consequently, an a-Si film is deposited on the film formation substrate 203 heated to about 200° C. to 350° C. by the heater 205.

In the above apparatus using the 13.56-MHz high frequency power, even the maximum deposition rate at which a-Si films meeting the performance of a recent electrophotographic photosensitive body can be formed is at most about 6 ($\mu$m/hour). If the deposition rate is further increased, it is sometimes impossible to obtain satisfactory characteristics as a photosensitive body. Generally, when an a-Si film is used as an electrophotographic photosensitive body, a film thickness of at least 20 to 30 $\mu$m is necessary to obtain charging power. Accordingly, a long processing time is required to manufacture an electrophotographic photosensitive body meeting the required performance.

As a method of increasing the deposition rate, a plasma CVD process (Plasma Chemistry and Plasma Processing, Vol. 7, No. 3, (1987) pp. 267–273) is reported. This technique suggests that the deposition rate can be increased without lowering the performance of the deposited film by increasing the discharge frequency to be higher than 13.56 MHz by using a high frequency power supply with a frequency higher than 13.56 MHz. This method of increasing the discharge frequency is performed in the field of sputtering and the like and has been extensively studied.

As described above, the conventional plasma processing apparatus has the drawback that a long processing time is required to manufacture an electrophotographic photosensitive body and the like. Therefore, it is necessary to decrease the deposition time without lowering the performance of the deposited film.

Unfortunately, it is found that if a frequency higher than 13.36 MHz, e.g., a high frequency of 100 MHz, is directly applied to the conventional apparatus, the deposition rate of the deposited film varies, or etching cannot be evenly performed. That is, it turns out that it is difficult to perform uniform plasma processing or film deposition on a substrate with a relatively large area.

This degrades various characteristics of the deposited film. The conventional plasma processing apparatus has many problems to be solved in order to form a deposited film having uniform characteristics at a uniform deposition rate.

SUMMARY OF THE INVENTION

It is an object of the present invention to solve the above conventional problems and provide a plasma processing apparatus and a plasma processing method capable of evenly performing plasma processing on a substrate having a relatively large area at a processing rate which cannot be achieved by any conventional plasma processing apparatus.

It is another object of the present invention to provide a plasma processing apparatus and a plasma processing method capable of forming a deposited film having uniform or substantially uniform characteristics in its entirety.

It is still another object of the present invention to provide a plasma processing apparatus and a plasma processing method capable of forming a deposited film at a uniform or substantially uniform deposition rate regardless of the position on a substrate where the film is deposited.

It is still another object of the present invention to provide a plasma processing apparatus and a plasma processing method capable of performing etching processing uniformly or substantially uniformly for an object to be etched.

It is still another object of the present invention to provide a plasma processing apparatus or method capable of generating a plasma uniformly or substantially uniformly.

The present invention provides a plasma processing apparatus comprising a reaction vessel having a dielectric member in a portion thereof, capable of accommodating a film formation substrate or an object to be processed, and capable of being evacuated, gas supply means for supplying a predetermined gas into the reaction vessel, a cathode electrode provided outside the reaction vessel and arranged in a position where the cathode electrode opposes the film formation substrate or the object to be processed accommodated in the reaction vessel via the dielectric member, and high frequency power supply means for supplying high frequency power of 30 MHz to 300 MHz to the cathode electrode.

The present invention also provides a plasma processing method performed in a plasma processing apparatus comprising a reaction vessel having a dielectric member in a portion thereof, capable of accommodating a film formation substrate or an object to be processed, and capable of being evacuated, gas supply means for supplying a predetermined gas into the reaction vessel, a cathode electrode provided outside the reaction vessel and arranged in a position where the cathode electrode opposes the film formation substrate or the object to be processed accommodated in the reaction vessel via the dielectric member, and high frequency power supply means for supplying high frequency power of 30 MHz to 300 MHz to the cathode electrode, wherein after the predetermined gas is supplied into the reaction vessel, high frequency power of 30 MHz to 300 MHz is supplied to the cathode electrode to generate a plasma between the dielectric member and the film formation substrate or the object to be processed in the reaction vessel, thereby forming a film on the film formation substrate or performing plasma processing for the object to be processed.

DETAILED DESCRIPTION OF THE PREFERRED EMBODIMENTS

As one means for solving the above conventional problems, it is reported that the deposition rate can be increased by using a high frequency power supply with a frequency higher than 13.56 MHz. To increase the deposition rate without lowering the performance of the deposited film, the present inventors used a high frequency power supply having a discharge frequency higher than 13.56 MHz in the plasma processing apparatus shown in FIG. 1 and extensively studied this apparatus. The results will be described below.

Figure 1:
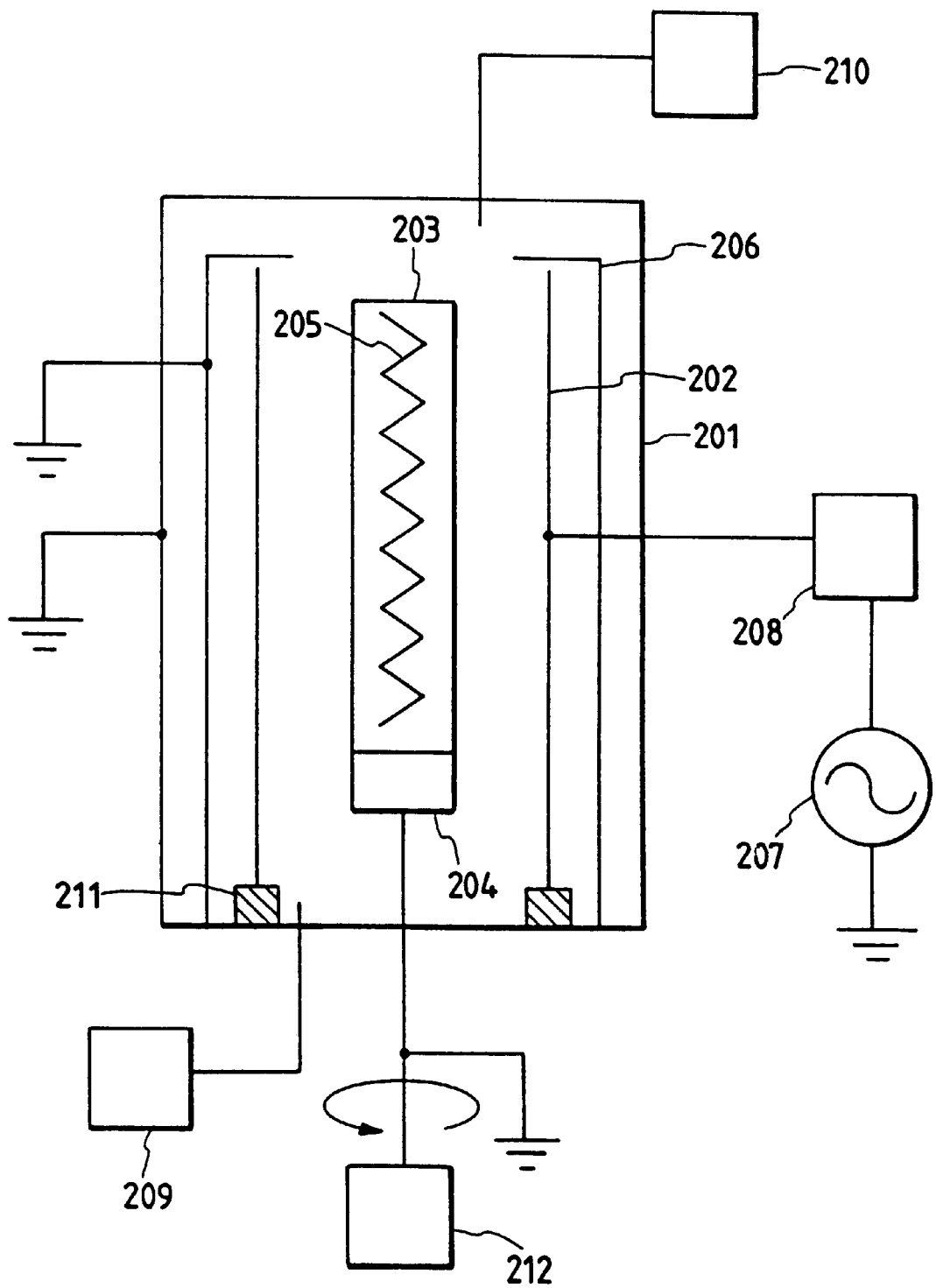
FIG. 1 is a schematic view for explaining one example of conventional plasma processing apparatuses.

In the conventional plasma processing apparatus shown in FIG. 1, if an electrophotographic photosensitive body having a diameter of, e.g., about 100 mm is used as the film formation substrate 203, an electrode having a diameter d of 200 to 300 mm is used as the cathode electrode 202 accordingly. When a high frequency is supplied from one point on the outer circumferential surface of the cathode electrode 202, the distance to a point at the opposite side on the outer circumferential surface of the cathode electrode 202 is 1.57 d. For example, if d=250 mm, the distance is about 390 mm. When a high frequency power supply with a frequency of 100 MHz is used, a wavelength k is approximately 3 m in the air. Consequently, in this plasma processing apparatus a high frequency supplied from one point on the outer circumferential surface of the cathode electrode 202 propagates on the outer circumferential surface of the cathode electrode 202 and reaches the opposite side. However, it is found that a standing wave is generated because the propagation distance is $\lambda/10$ or more and an electric field distribution is formed on the outer circumferential surface of the cathode electrode under the influence of this standing wave. It is found that under the influence of this electric field, i.e., an RF field, generated on the outer circumferential surface of the cathode electrode, an uneven field is formed on the inner circumferential surface of the cathode electrode 202 and this produces uneven discharge in the circumferential direction.

Additionally, in the above plasma processing apparatus, the length of the electrophotographic photosensitive body as the film formation substrate 203 is usually about 350 mm. Accordingly, the length of the cathode electrode 202 is about 350 to 400 mm. It turns out that, as a consequence, uneven discharge similar to that in the circumferential direction also occurs in the axial direction (longitudinal direction).

From the foregoing, it is found that in the conventional plasma processing apparatus, film deposition can be performed at a higher deposition rate by increasing the frequency, but uneven discharge occurs because the discharge frequency is raised, and this poses another problem to be described below which is not brought about at a discharge frequency of 13.56 MHz.

That is, raising the discharge frequency unevenly distributes the plasma and makes the deposition rate nonuniform. As a result, in an object to be processed having a relatively large area, e.g., an electrophotographic photosensitive body, a film thickness variation (in the case of, e.g., an electrophotographic photosensitive body, a film thickness variation of ±20% or more) which is practically undesirable occurs. This film thickness variation is a serious problem not only in an electrophotographic photosensitive body but also in the formation of a crystalline or non-single-crystal functional deposited film for use in, e.g., an image input line sensor, an image pickup device, and a photovoltaic device. Also, even in other plasma processes such as dry etching and sputtering, similar unevenness of processing occurs to pose a big problem when the discharge frequency is raised.

The present invention is based on the finding that the above problems can be solved by a plasma processing apparatus comprising a reaction vessel having a dielectric member in a portion thereof which is capable of accommodating a film formation substrate or an object to be processed. It is further capable of being evacuated. Gas supply means for supplying a predetermined gas into the reaction vessel, a cathode electrode provided outside the reaction vessel and arranged in a position where the cathode electrode opposes the film formation substrate or the object to be processed housed in the reaction vessel via the dielectric member, and high frequency power supply means for supplying high frequency power of 30 MHz to 300 MHz to the cathode electrode are also included.

In the above plasma processing apparatus, the cathode electrode can also be subjected to geometric machining. This geometric machining can be aperture formation or slit formation.

Also, a soft magnetic material can be used in a portion of the cathode electrode.

In each of the above plasma processing apparatuses, the cathode electrode can also be a cylindrical electrode. If this is the case, the film formation substrate can be a cylindrical substrate, and the film formation substrate and the cathode electrode can be coaxially arranged.

The cathode electrode and the film formation substrate or the object to be processed can also be flat plates opposing each other.

The present invention is also based on the finding that the above conventional problems can be solved by a plasma processing method performed in any of the above plasma processing apparatuses, wherein after a predetermined gas is supplied into the reaction vessel, high frequency power of 30 MHz to 300 MHz is supplied to the cathode electrode to generate a plasma between the dielectric member and the film formation substrate or the object to be processed in the reaction vessel, thereby forming a film on the film formation substrate or performing plasma processing for the object to be processed.

The deposition rate can be increased by raising the discharge frequency to be higher than 13.56 MHz. However, if the discharge frequency is higher than 13.56 MHz, a standing wave which causes uneven discharge is generated on the outer circumferential surface of the cathode electrode. Under the influence of this standing wave, nonuniformity of intensity occurs in the plasma. Therefore, the apparatus must be so constructed that the RF standing wave which causes the uneven RF voltage on the cathode electrode is not reflected on the uneven intensity of plasma. Also, the distribution of the plasma is sensitive to the shape of the cathode electrode. Accordingly, to prevent unevenness of the high frequency power supplied on the surface of the cathode electrode, it is necessary to adjust the distribution of the high frequency propagating on the rear surface or the front surface of the cathode electrode.

In the plasma processing apparatus and the plasma processing method according to the present invention, the cathode electrode and the film formation substrate, or the object to be processed, are opposed to each other via the dielectric member constituting part of the reaction vessel. Therefore, the high frequency power from the cathode electrode is supplied via the dielectric member, so a plasma is generated between the dielectric member and the film formation substrate or the object to be processed. In the plasma processing apparatus in which the high frequency power is supplied from the cathode electrode via the dielectric member as described above, the unevenness of discharge occurring on the inner circumferential surface of the cathode electrode under the influence of the standing wave can be reduced by the dielectric member. This prevents a film thickness variation or uneven etching.

Also, since the cathode electrode is arranged outside the reaction vessel, the shape and material of the cathode electrode can be freely changed without opening the reaction vessel. Accordingly, the RF distribution on the cathode electrode can be adjusted by changing the complex impedance in an arbitrary position of the cathode electrode by changing the shape and material of the cathode electrode. The result is a substantially uniform potential distribution on the cathode electrode. Furthermore, an optimum shape and an optimum material of the cathode electrode change in accordance with the shape of the film formation substrate, the plasma processing conditions, and the discharge frequency. Since the cathode electrode is arranged outside the reaction vessel as described above, only the cathode electrode needs to be replaced; that is, it is unnecessary to open the reaction vessel into the air. Consequently, it is readily possible to control changes in various processing conditions. For a similar reason, an optimum cathode electrode can be easily determined by trial and error. Even if a slight potential distribution is formed on the cathode electrode, the dielectric member is arranged between the cathode electrode and plasma and the buffering effect of this dielectric material makes the plasma distribution more uniform than the potential distribution on the cathode electrode.

It is experimentally confirmed that a plasma density variation (which is defined as a value obtained by dividing the difference between the maximum and minimum values of the plasma density by its average value) is ±10% near 30 MHz and this significantly increases the RF voltage unevenness on the cathode electrode caused by the discharge frequency. A frequency exceeding 300 MHz is impractical because this makes the RF matching circuit difficult to design and increases the transmission loss. Also, the energy of ions incident on the film formation substrate is about 30 eV at 13.56 MHz, about 15 eV at 30 MHz, and about 10 eV at 100 MHz. In a process using the energy of incident ions onto the film formation substrate, decreasing the width of this energy is important since the controllability can be improved. Therefore, the use of a frequency of 30 MHz or higher is desirable. In the plasma processing apparatus and the plasma processing method of the present invention, a high frequency of 30 MHz to 300 MHz is used by taking these factors into consideration. Accordingly, it is possible to provide a practical plasma processing apparatus in which the controllability of the RF voltage distribution on the cathode electrode is excellent, the degree of freedom of design of an RF matching circuit is high, and the transmission loss is small.

Embodiments of the present invention will be described below with reference to the accompanying drawings.

A plasma processing apparatus of the present invention is characterized in that a high frequency power supply which supplies power with a frequency higher than 13.56 MHz is used, the shape of a cathode electrode can be freely changed so as to suppress generation of a standing wave, and a buffering function is provided between the standing wave on the surface of the cathode electrode and plasma so that the RF standing wave which causes an uneven RF voltage on the cathode electrode is not reflected in unevenness of the intensity of the plasma.

Figure 2:
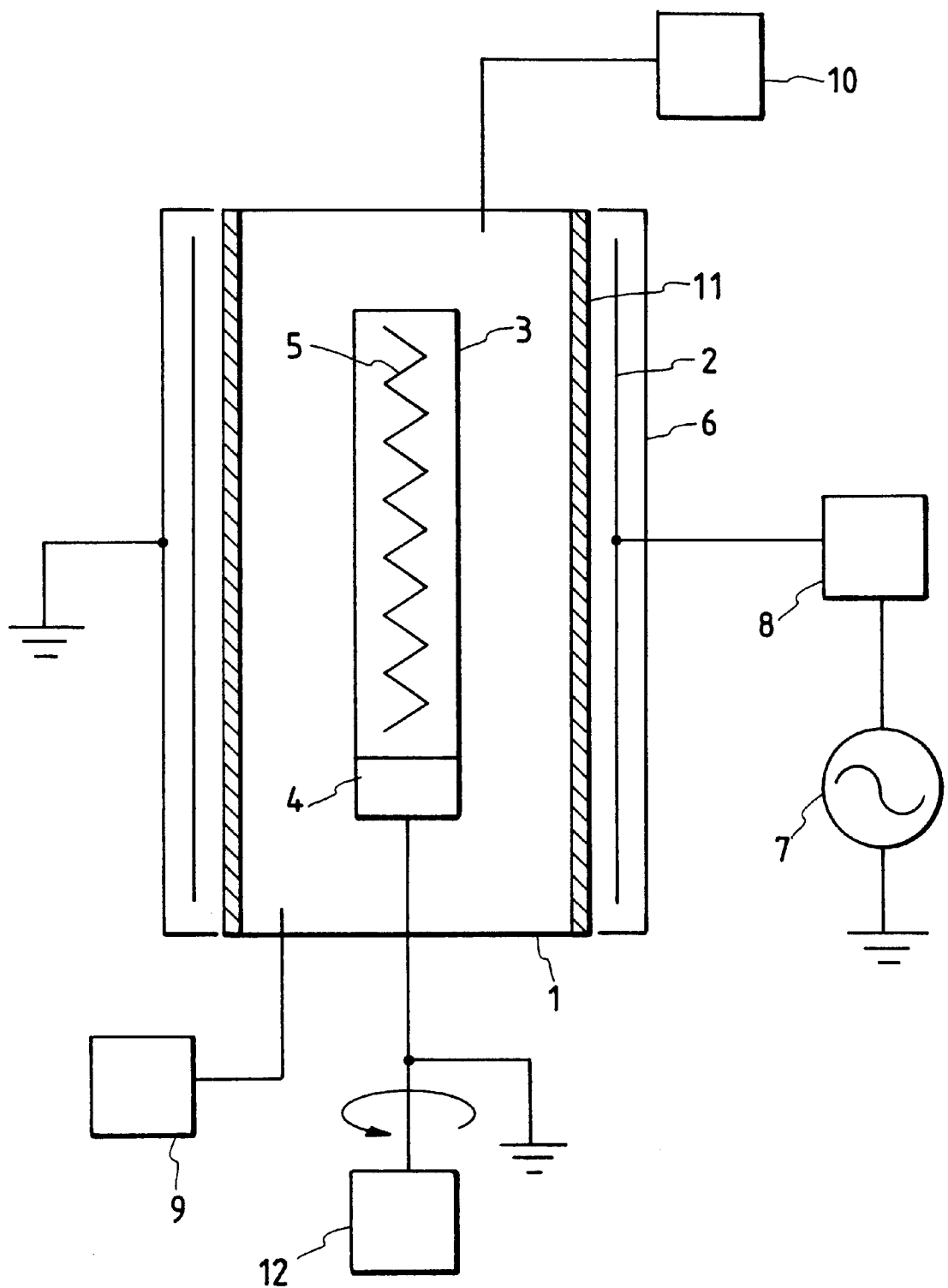
FIGS. 2 and 5 are schematic views for explaining preferred embodiments of a plasma processing apparatus of the present invention.

FIG. 2 is a schematic view showing the outline of a cylindrical coaxial plasma CVD apparatus as a plasma processing apparatus according to the first embodiment of the present invention.

Referring to FIG. 2, a reaction vessel 1 is a vessel capable of being evacuated and a portion of the vessel is a dielectric tube made of a dielectric member 11. This reaction vessel 1 is connected to an evacuating means 9, as a gas introducing means, for evacuating the vessel and a gas supply means 10 for supplying a predetermined gas into the vessel.

A cylindrical cathode electrode 2 electrically insulated from the reaction vessel 1 is arranged outside the dielectric tube of the reaction vessel 1. A grounding shield 6 is formed outside the cathode electrode 2. The reaction vessel 1 accommodates a cylindrical film formation substrate 3 as a counter electrode. The cylindrical cathode electrode 2 and the film formation substrate 3 are coaxially arranged. The cylindrical cathode electrode 2 is connected to a discharge high frequency power supply 7 via a matching circuit 8. The film formation substrate 3 is held by a substrate holder 4 having a rotating mechanism driven by a motor 12. The film formation substrate 3 incorporates a heater 5 and can be heated to a predetermined temperature from the inside by the heater 5.

The dielectric member 11 can be made from any material as long as the loss of a high frequency is small. For example, it is possible to use alumina ceramics, quartz glass, pyrex, and Teflon. Since the dielectric member 11 is used as a portion of the reaction vessel 1 capable of being evacuated and the reaction vessel 1 is evacuated, the dielectric member 11 must have a thickness which can resist the atmospheric pressure. Although the thickness depends upon the shape and dimensions, it is generally at least 5 mm, and desirably 10 mm or more. When the dielectric member 11 with this thickness was arranged between the cathode electrode and plasma while a discharge frequency of 13.56 MHz was used, a reactance component $i/j\omega C$ of the complex impedance ascribed to a capacitance C of the dielectric material became 10 to 50 Ω which was equivalent to the plasma impedance. Consequently, it was difficult to efficiently supply a high frequency to the plasma. However, since a high discharge frequency is used in this embodiment, the complex impedance attributed to the dielectric member 11 decreases in inverse proportion to the frequency. Accordingly, even when the dielectric member 11 having the above thickness is arranged between the cathode electrode and plasma, a high frequency can be efficiently supplied to the plasma.

In this embodiment, the cylindrical cathode electrode 2 is arranged outside the reaction vessel 1. Therefore, the shape and material of the cylindrical cathode electrode 2 can be largely changed to obtain even discharge in a large area. Consequently, it is possible to change the complex impedance at an arbitrary point on the cylindrical cathode electrode 2. Note that an optimum shape and an optimum material of this cylindrical cathode electrode 2 change in accordance with the shape of the film formation substrate, the plasma processing conditions, and the discharge frequency.

It is experimentally confirmed that a plasma density variation (which is defined as a value obtained by dividing the difference between the maximum and minimum values of the plasma density by its average value) is ±10% near 30 MHz and this significantly increases the RF voltage unevenness on the cathode electrode caused by the discharge frequency. A frequency exceeding 300 MHz is impractical because this makes the RF matching circuit difficult to design and increases the transmission loss. Also, the energy of ions incident on the film formation substrate is about 30 eV at 13.56 MHz, about 15 eV at 30 MHz, and about 10 eV at 100 MHz. In a process using the energy of incident ions onto the film formation substrate, decreasing the width of this energy is important since the controllability can be improved. Therefore, the use of a frequency of 30 MHz or higher is desirable. From the foregoing, the plasma processing apparatus of this embodiment uses a power supply capable of supplying high frequency power of 30 MHz to 300 MHz as the high frequency power supply 7.

To form, e.g., an a-Si film by using this plasma processing apparatus, the reaction vessel 1 is evacuated to a high vacuum by the evacuating means 9. The gas supply means 10 supplies a source gas such as silane gas, disilane gas, methane gas, or ethane gas and a doping gas such as diborane gas to maintain the pressure at several tens of millitorr to a few torr. Subsequently, the high frequency power supply 7 supplies high frequency power to the cylindrical cathode electrode 2 to generate a plasma between the dielectric member and the film formation substrate 3, thereby decomposing the source gas supplied into the vessel. At this time, the film formation substrate 3 is heated to about 200° C. to 350° C. by the heater 5 and an a-Si film is deposited on the film formation substrate 3.

When the high frequency power is supplied to the plasma, the matching circuit 8 adjusts the impedance of the high frequency power supplied from the high frequency power supply 7 so that the impedance matches the impedance of the plasma. This high frequency power with the adjusted impedance is supplied to the rear surface of the cylindrical cathode electrode 2. Consequently, the high frequency propagates from the rear surface to the front surface of the cathode electrode 2 through the surface layer of the cathode electrode, and the high frequency power is supplied to the plasma. To prevent unevenness of the high frequency power on the surface of the cylindrical cathode electrode 2, the distribution of the high frequency propagating on the rear surface or the front surface of the cylindrical cathode electrode 2 is adjusted. That is, the complex impedance at an arbitrary point on the cylindrical cathode electrode 2 is changed by changing the shape and material of the cylindrical cathode electrode 2, thereby making the plasma processing uniform. More specifically, an optimum shape and an optimum material of the cylindrical cathode electrode 2 are obtained by the following adjustments, and the plasma processing is made uniform accordingly:

1) the length of the cylindrical cathode electrode 2 is adjusted in accordance with the discharge frequency and the length of the film formation substrate.

2) apertures or slits are formed in the cylindrical cathode electrode 2 so that the high frequency power propagates from the rear surface of the cathode electrode through these apertures or slits. The size of these apertures or slits is adjusted.

3) a soft magnetic material having a high permeability, e.g., permalloy, is used in a portion of the cylindrical cathode electrode 2, and an inductance L in that portion is increased to suppress the transmission of the high frequency power. In this manner the transmission of the high frequency power in the cylindrical cathode electrode 2 is adjusted.

Note that the step of obtaining an optimum shape and an optimum material of the cylindrical cathode electrode 2 need not be performed if uneven discharge occurring on the inner circumferential surface of the cylindrical cathode electrode 2 is removed by the buffering action of the dielectric member 11.

<Example 1> to <Example 5> will be described below as practical examples of the plasma processing apparatus of the above first embodiment, and the results of comparison with a conventional apparatus will be explained.

EXAMPLE 1

In this example, the discharge frequency was set to 100 MHz, and an a-Si film was formed on the film formation substrate 3 under the film formation conditions shown in Table 1 below.

TABLE 1

| | |
|---|---|
| Source gas | $SiH_4$ |
| Carrier gas | $H_2$ |
| Gas flow rates | $SiH_4$ 350 sccm |
| | $H_2$ 350 sccm |
| Pressure | 0.03 torr |
| Substrate temperature | 250° C. |
| High frequency power | 0.5 W/cm$^2$ |

An Al simple cylindrical electrode having an inner diameter of 250 mm and a length of 300 mm was used as the cylindrical cathode electrode 2. An alumina ceramics dielectric tube 10 mm thick was used as the dielectric member 11 constituting part of the reaction vessel 1. Note that when the film formation conditions are changed, the length of the cylindrical cathode electrode 2 needs to be changed accordingly. Therefore, the length of the cylindrical cathode electrode 2 is not restricted to the one in this example and is desirably properly selected.

When film formation was performed by using the plasma processing apparatus in which the cylindrical cathode electrode 2 as described above was arranged outside the reaction vessel 1, the average film formation rate was 18 (μm/hr) and the film thickness variation was approximately ±15%. In contrast, when film formation was done by using a plasma processing apparatus (conventional apparatus) in which a 300-mm long Al simple cylindrical cathode electrode was arranged inside the reaction vessel 1, the film thickness variation was approximately ±30%. Consequently, when the cylindrical cathode electrode 2 was arranged outside the reaction vessel 1, it was possible to obtain the film thickness distribution improving effect for the film thickness variation.

Additionally, the influence of the thickness distribution was large in the formed film. The local film quality of the a-Si film was measured in the same film thickness state, and it was found that the film quality was usable as, e.g., an electrophotographic photosensitive device or an image input line sensor.

In the plasma processing apparatus of this example as described above, the cathode electrode is arranged outside the reaction vessel, and a high frequency is supplied to the plasma via a dielectric member constituting part of the reaction vessel capable of being evacuated. This buffers the influence of the potential distribution of the high frequency on the cathode electrode. Consequently, no film thickness variation is produced even when the discharge frequency is raised.

EXAMPLE 2

Figure 3:
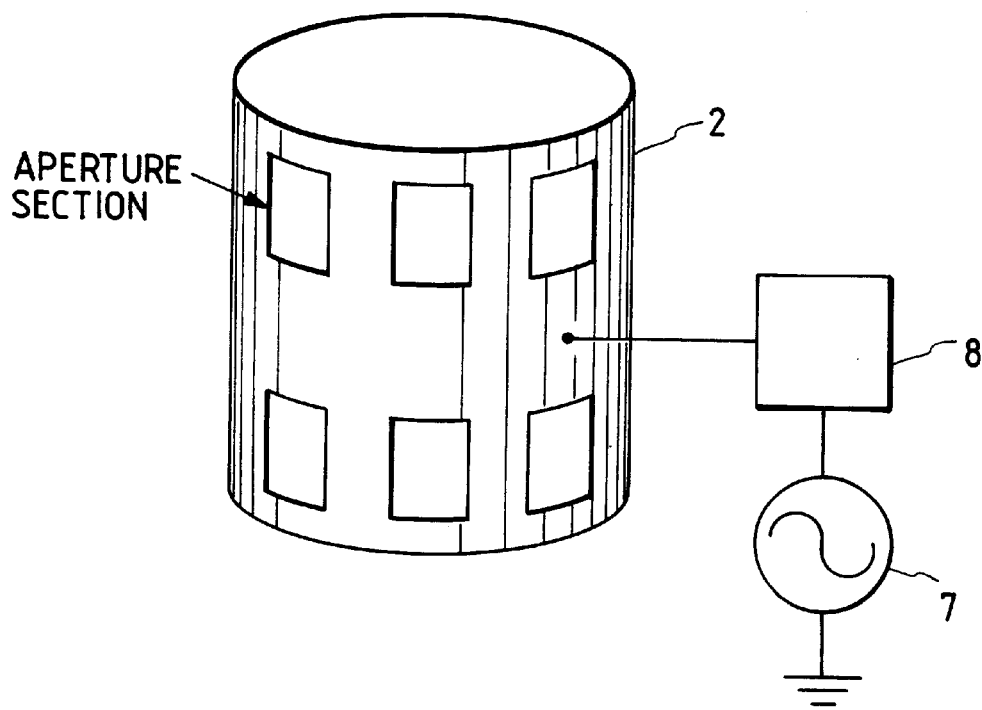
FIGS. 3, 4, 6, and 7 are schematic perspective views for explaining preferred embodiments of a cathode electrode.

In this example, an aperture Al cylinder having a plurality of apertures formed in its wall as shown in FIG. 3 was used as the cylindrical cathode electrode 2. Following the same procedure as in Example 1, the discharge frequency was set to 100 MHz and an a-Si film was formed on the film formation substrate 3 under the film formation conditions in Table 1 described above. Note that when the film formation conditions are changed, the aperture shape sometimes needs to be changed accordingly. Note also that similar effects can sometimes be obtained from entirely different shapes. Therefore, the aperture shape is not limited to the shape shown in FIG. 3 and is desirably properly chosen.

The film thickness variation in the circumferential direction when film formation was performed by using this aperture cathode electrode was measured and found to be about ±5%. Compared to the value of about ±15% obtained by the simple cylindrical cathode in Example 1, the film thickness distribution improving effect was enhanced. Also, the average film formation rate was equivalent to that in Example 1.

The influence of the film thickness distribution was large in each formed film. The local film quality of the a-Si film was measured in the same film thickness state, and it was found that the film quality was usable as, e.g., an electrophotographic photosensitive device or an image input line sensor.

In the plasma processing apparatus of this example as described above, the cathode electrode is arranged outside the reaction vessel. Accordingly, it is readily possible to freely control the geometric shape of the cathode electrode without inducing anomalous discharge. Consequently, the path and the standing wave of the cathode electrode for transmitting a high frequency can be changed, and this permits free control of the RF voltage distribution on the cathode electrode. As a consequence, it is possible to avoid a film thickness variation when the discharge frequency is raised.

EXAMPLE 3

Figure 4:
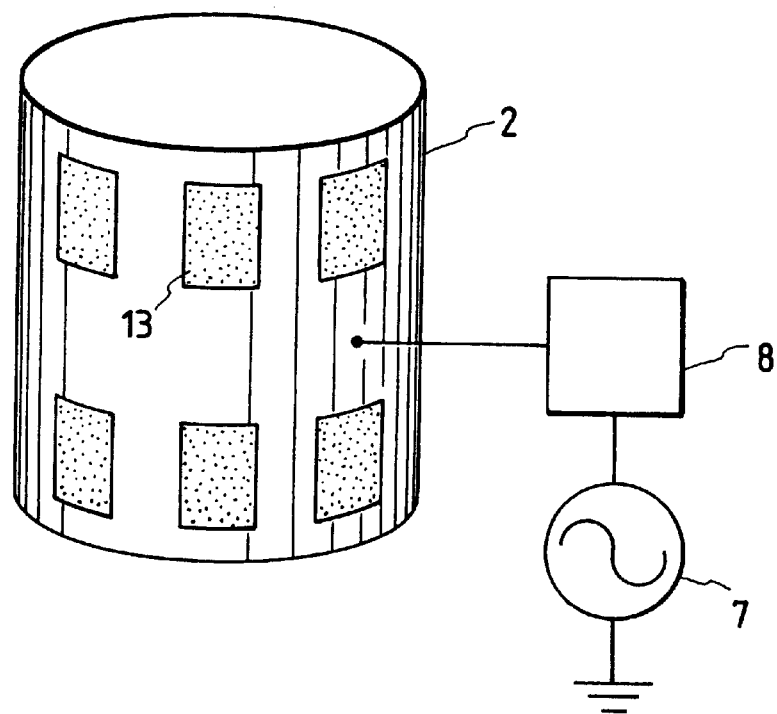

In this example, permalloy sheets 13 in a predetermined pattern as shown in FIG. 4 were adhered as a soft magnetic material to the cylindrical cathode electrode 2. Following the same procedure as in Example 1, the discharge frequency was set to 100 MHz and an a-Si film was formed on the film formation substrate 3 under the film formation conditions in Table 1 described above. Note that permalloy was used as the soft magnetic material in the cylindrical cathode electrode 2, but any soft magnetic material can be used. Note also that when the film formation conditions are changed, the pattern of the soft magnetic material sometimes needs to be changed accordingly, and that similar effects can sometimes be obtained from entirely different patterns. Therefore, the pattern of the permalloy sheets is not limited to the pattern shown in FIG. 4 and is desirably appropriately selected.

When film formation was performed by using the cylindrical cathode electrode 2 shown in FIG. 4, the average film formation rate was equivalent to that in Example 1 and the film thickness variation was approximately ±5% when the soft magnetic material was adhered to portions of the outer circumferential surface of the cathode. Compared to the film thickness variation of about ±15% in Example 1, the film thickness distribution improving effect was enhanced by the use of the soft magnetic material.

The influence of only the film thickness distribution was large in each formed film. The local film quality of the a-Si film was measured in the film thickness state formed in Example 3, and it was found that the film quality was usable as, e.g., an electrophotographic photosensitive device or an image input line sensor.

In the plasma processing apparatus of this example as described above, a soft magnetic material is used in portions of the cathode electrode and the complex impedance at a high frequency can be increased accordingly. Consequently, the path of the high frequency can be controlled only in a portion other than the soft magnetic material. Also, as in Example 2 described above, the RF voltage distribution on the cathode electrode can be freely controlled. As a consequence, it is possible to avoid a film thickness variation when the discharge frequency is raised.

The cylindrical coaxial plasma CVD apparatus in which the cylindrical cathode electrode 2 is arranged outside the reaction vessel 1 has been described above. However, the present invention is readily applicable to a parallel plate plasma processing apparatus provided that the cylindrical cathode electrode 2 can be arranged outside the reaction vessel.

Figure 5:
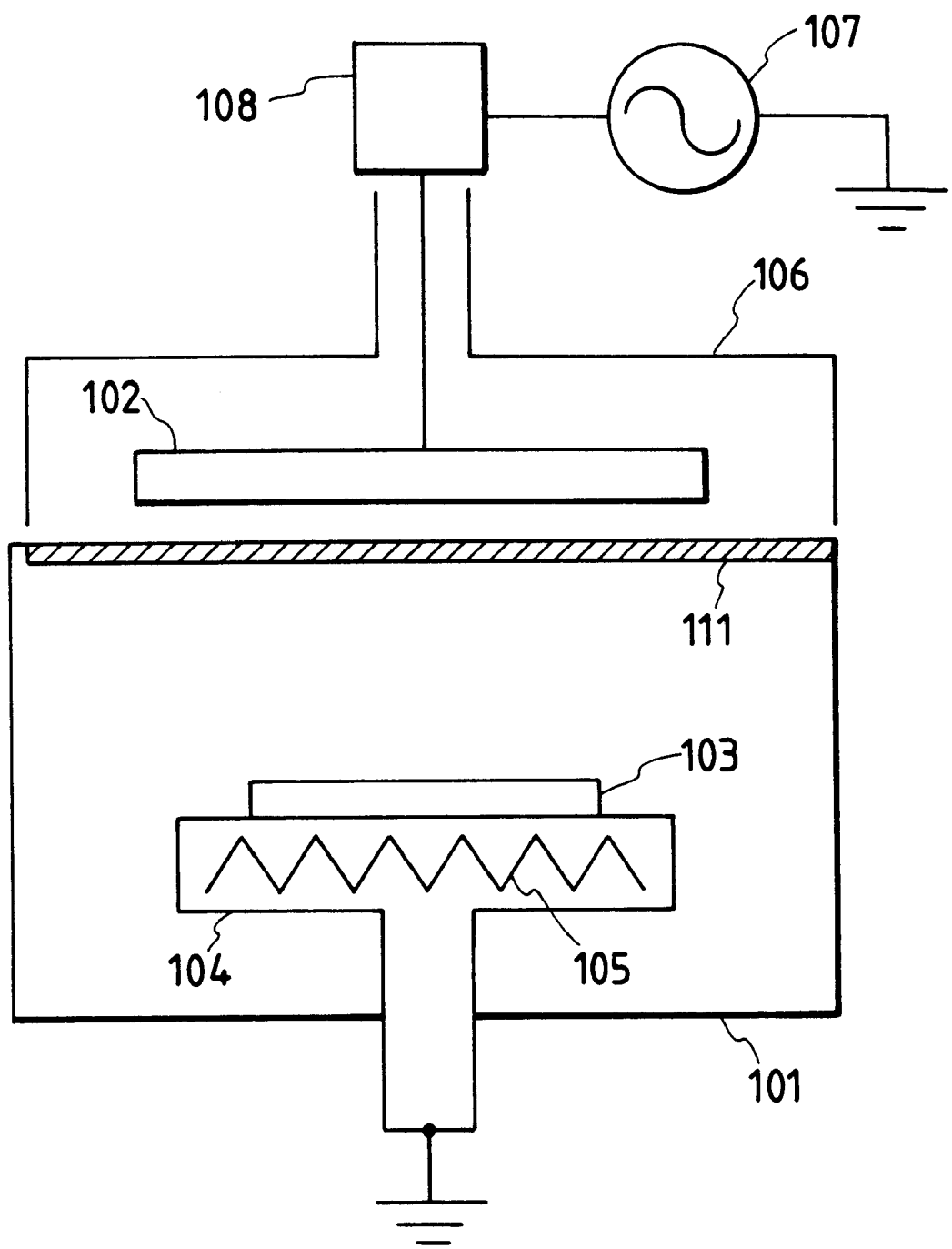

FIG. 5 is a schematic view showing the outline of a parallel plate plasma CVD apparatus as a plasma processing apparatus according to the second embodiment of the present invention.

In FIG. 5, a reaction vessel 101 is a vessel capable of being evacuated, and a portion of the vessel is made of a dielectric square member 111. As in the plasma processing apparatus of the first embodiment described previously, the reaction vessel 101 is connected to an evacuating means (not shown), as a gas introducing means, for evacuating the vessel and a gas supply means (not shown) for supplying a gas into the vessel.

A plate-like square cathode electrode 102 electrically insulated from the reaction vessel 101 is arranged outside the reaction vessel 101. A plate-like film formation substrate 103 as a counter electrode is arranged inside the reaction vessel 101. These electrodes are opposed to each other via the dielectric member 111.

The square cathode electrode 102 is provided in the space surrounded by a grounding shield 106 and is connected to a high frequency power supply 107 for discharge via a matching circuit 108.

The film formation substrate 103 is placed on a substrate holder 104 incorporating a heater 105 and is heated to a predetermined temperature by the heater 105. A portion of the substrate holder 104 is extended to the outside of the reaction vessel 101 and grounded.

In this parallel plate plasma CVD apparatus, as in the cylindrical coaxial plasma CVD apparatus of the first embodiment, high frequency power is supplied to the square cathode electrode 102 to generate a plasma between the dielectric member 111 and the film formation substrate 103, thereby forming an a-Si film on the film formation substrate 103. As in the first embodiment, the plasma processing is made uniform by adjusting the square cathode electrode 102.

<Example 4> to <Example 6> will be described below as practical examples of the plasma processing apparatus of the second embodiment, and the results of comparison with a conventional apparatus will be explained.

EXAMPLE 4

In this example, the parallel plate plasma CVD 15 apparatus shown in FIG. 5 was used to form an a-Si film on a film formation substrate by setting the discharge frequency to 100 MHz under film formation conditions shown in Table 2 below.

TABLE 2

| Source gas | $SiH_4$ | |
|---|---|---|
| Carrier gas | $H_2$ | |
| Gas flow rates | $SiH_4$ | 450 sccm |
| | $H_2$ | 450 sccm |
| Pressure | 0.03 torr | |
| Substrate temperature | 250° C. | |
| High frequency power | 0.5 W/cm$^2$ | |

The film formation substrate 103 was a square substrate, and a square plate of 450 mm side was used as the square cathode electrode 102. As the square dielectric member 111, a 20-mm thick alumina ceramics member was used.

In this parallel plate plasma CVD apparatus, the distances from the position where the high frequency was supplied to the square cathode electrode 102 to an edge and a corner of the square shape were different, so a film thickness distribution was easily produced. In this apparatus, the average film formation rate was 15 ($\mu$m/hr) and the film thickness variation was about ±18%. As a comparative example, the square cathode electrode 102 was arranged inside the reaction vessel 101 and film formation was performed under the same conditions as above. Consequently, the film thickness variation was about ±35%. From this result the film thickness distribution improving effect was confirmed.

The influence of only the film thickness distribution was large in each formed film. The local film quality of the a-Si film was measured in the film thickness state formed in Example 4, and it was found that the film quality was usable as, e.g., an electrophotographic photosensitive device or an image input line sensor.

EXAMPLE 5

Figure 6:
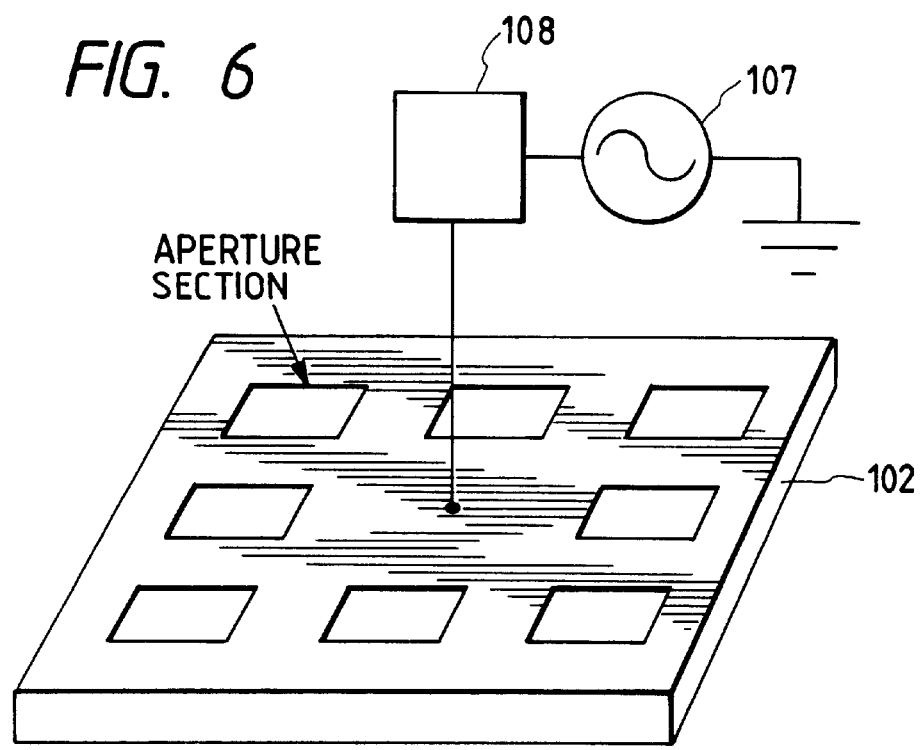

In this example, the square cathode electrode 102 subjected to geometric machining as shown in FIG. 6 was used. When the film formation conditions are changed, the geometric shape of the cathode electrode sometimes needs to be modified accordingly. Also, similar effects can sometimes be obtained from entirely different shapes. Therefore, the geometric shape is not limited to the shape shown in FIG. 6 and is desirably properly selected.

The film thickness variation was measured when film formation was performed by using the square cathode electrode 102 having the shape shown in FIG. 6. Consequently, the average film formation rate was 15 ($\mu$m/hr) and the film thickness variation was about ±10%. Compared to the film thickness variation of about ±18% in Example 4 described above, a higher film thickness uniformity could be obtained.

The influence of only the distribution was large in each formed film. The local film quality of the a-Si film was measured in the film thickness state formed in Example 5, and it was found that the film quality was well practically usable as, e.g., an electrophotographic photosensitive device or an image input line sensor.

EXAMPLE 6

Figure 7:
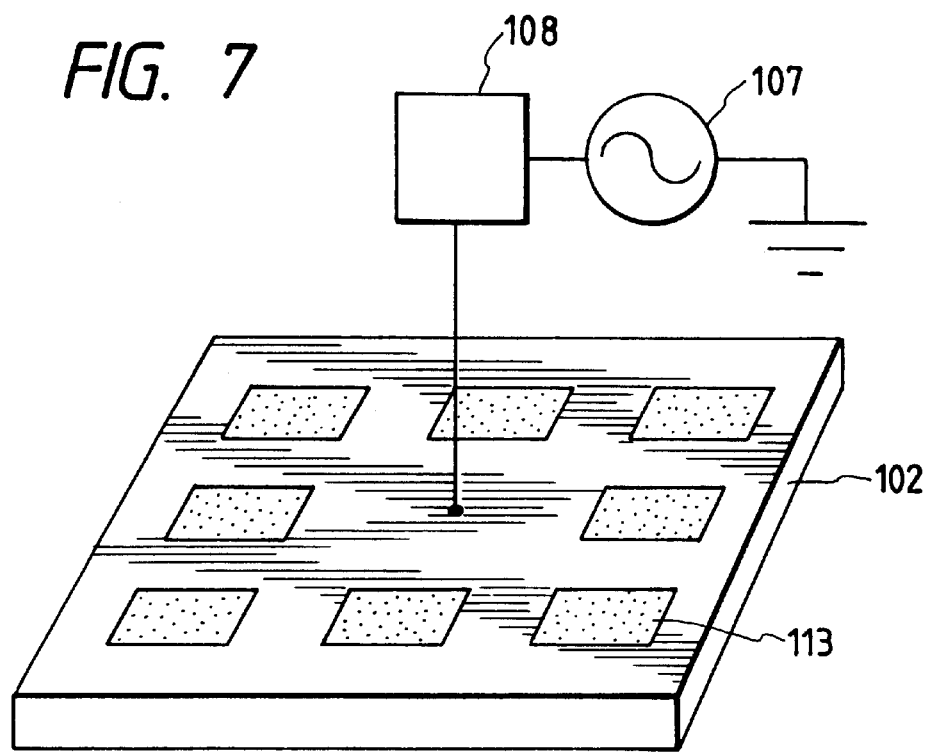

In this example, permalloy sheets 113 in a pattern shown in FIG. 7 were adhered to the square cathode electrode 102. Although permalloy was used as the soft magnetic material, any soft magnetic material can be used. When the film formation conditions are changed, the pattern of the soft magnetic material sometimes needs to be modified accordingly. Also, similar effects can sometimes be obtained from entirely different patterns. Therefore, the pattern is not limited to the one shown in FIG. 7 and is desirably properly selected.

The film thickness variation was measured when film formation was performed with the cathode electrode shown in FIG. 7. As a consequence, the average film formation rate was 15 ($\mu$m/hr) and the film thickness variation was about ±10%. Compared to the film thickness variation of about ±18% in Example 4 described above, a higher film thickness uniformity could be obtained.

The influence of the film thickness distribution was large in each formed film. The local film quality of the a-Si film was measured in the film thickness state formed in Example 6, and it was found that the film quality was usable as, e.g., an electrophotographic photosensitive device or an image input line sensor.

The present invention has the arrangements as described above and can therefore achieve the following effects.

In the plasma processing apparatus and the plasma processing method of the present invention, a substrate having a relatively large area can be uniformly processed with a plasma at a processing rate which cannot be achieved by any conventional plasma processing apparatus.

Additionally, the cathode electrode is arranged outside the reaction vessel and hence can be replaced without opening the reaction vessel into the atmosphere. Consequently, it is readily possible to determine by trial and error the optimum shape and the optimum material of the cathode electrode by which no standing wave is produced (or even if a standing wave is produced, its influence is small).

Also, in the present invention the complex impedance at an arbitrary point on the cathode electrode can be changed by performing geometric machining for the cathode electrode. This further improves the uniformity of plasma processing.

Furthermore, in the present invention the complex impedance at an arbitrary point on the cathode electrode can be changed by using a soft magnetic material in a portion of the cathode electrode. This further improves the uniformity of plasma processing.

The present invention is not limited to the above embodiments and is applicable to various types of plasma processing, such as etching, other than film formation. It is of course possible to make modifications and combinations of the present invention without departing from the spirit and scope of the invention.

What is claimed is:

1. A plasma processing method performed in a plasma processing apparatus comprising:
   a vessel having a member for reducing high frequency distribution in a portion thereof, capable of housing a film formation substrate or an object to be processed, and capable of being evacuated;
   gas supply means for supplying a predetermined gas into the vessel;
   a cathode electrode provided outside the vessel and arranged in a position where the cathode electrode faces the object to be processed housed in the vessel, an empty space being provided between the member for reducing high frequency distribution and the cathode electrode; and
   high frequency power supply means for supplying high frequency power of 30 MHz to 300 MHz to the cathode electrode, the method comprising the steps of:
   supplying a predetermined gas into the vessel;
   supplying high frequency power of 30 MHz to 300 MHz to the cathode electrode to generate a plasma between the member for reducing high frequency distribution and the object to be processed in the vessel, the member having a thickness of 5 mm or more, thereby performing plasma processing for the object to be processed.

2. The plasma processing method according to claim 1, wherein the member for reducing high frequency distribution is a dielectric.

3. The plasma precessing method according to claim 1, wherein the processing is to form a deposited film on the object to be processed.

4. The plasma processing method according to claim 1, wherein the cathode electrode is subjected to geometric machining.

5. The plasma processing method according to claim 4, wherein the geometric machining is either of aperture formation or slit formation.

6. The plasma processing method according to claim 1, wherein a soft magnetic material is used in a portion of the cathode electrode.

7. The plasma processing method according to claim 1, wherein the cathode electrode is a cylindrical electrode.

8. The plasma processing method according to claim 7, wherein the object to be processed is cylindrical, and the object to be processed and the cathode electrode are coaxially arranged.

9. The plasma processing method according to claim 1, wherein the cathode electrode and the object to be processed are flat plates facing each other.

10. The plasma processing method according to claim 1, wherein the cathode electrode has a length longer than the object to be processed.

11. The plasma processing method according to claim 1, wherein the member for reducing high frequency distribution has a length longer than the object to be processed.

12. A plasma processing method comprising the steps of:
   housing an object to be processed in a vessel having a member for reducing high frequency distribution in a portion thereof and capable of being evacuated;
   reducing a pressure inside the vessel;
   supplying a gas into the vessel;
   supplying high frequency power of 30 MHz to 300 MHz to a cathode electrode, the cathode electrode being provided outside the vessel, an empty space being provided between the member for reducing high frequency distribution and the cathode electrode, to generate a plasma between the member for reducing high frequency distribution, the member having a thickness of 5 mm or more, and the object to be processed in the vessel, thereby performing plasma processing for the object to be processed.

13. The plasma processing method according to claim 12, wherein the member for reducing high frequency distribution is a dielectric.

14. The plasma processing method according to claim 12, wherein the processing is to form a deposited film on the object to be processed.

15. The plasma processing method according to claim 12, wherein the cathode electrode is subjected to geometric machining.

16. The plasma processing method according to claim 15, wherein the geometric machining is either of aperture formation or slit formation.

17. The plasma processing method according to claim 12, wherein a soft magnetic material is used in a portion of the cathode electrode.

18. The plasma processing method according to claim 12, wherein the cathode electrode is a cylindrical electrode.

19. The plasma processing method according to claim 18, wherein the object to be processed is cylindrical, and the object to be processed and the cathode electrode are coaxially arranged.

20. The plasma processing method according to claim 12, wherein the cathode electrode and the object to be processed are flat plates facing each other.

21. The plasma processing method according to claim 12, wherein the cathode electrode has a length longer than the object to be processed.

22. The plasma processing method according to claim 12, wherein the member for reducing high frequency distribution has a length longer than the object to be processed.

23. A plasma processing method comprising the steps of:
   housing an object to be processed in a vessel having a member for reducing high frequency distribution in a portion thereof and capable of being evacuated;

reducing a pressure inside the vessel;

supplying a gas into the vessel;

supplying high frequency power of 30 MHz to 300 MHz to a cathode electrode, the cathode electrode being provided outside the vessel and being arranged so as to face the member for reducing high frequency power distribution, the member having a thickness of 5 mm or more, to supply an electromagnetic wave into the vessel through the member for reducing high frequency distribution, whereby a plasma is generated between the member for reducing high frequency distribution and the object to be processed in the vessel to perform plasma processing for the object to be processed.

24. The plasma processing method according to claim 23, wherein the member for reducing high frequency distribution is a dielectric.

25. The plasma processing method according to claim 23, wherein the processing is to form a deposited film on the object to be processed.

26. The plasma processing method according to claim 23, wherein the cathode electrode is subjected to geometric machining.

27. The plasma processing method according to claim 26, wherein the geometric machining is either of aperture formation or slit formation.

28. The plasma processing method according to claim 23, wherein a soft magnetic material is used in a portion of the cathode electrode.

29. The plasma processing method according to claim 23, wherein the cathode electrode is a cylindrical electrode.

30. The plasma processing method according to claim 29, wherein the object to be processed is cylindrical, and the object to be processed and the cathode electrode are coaxially arranged.

31. The plasma processing method according to claim 23, wherein the cathode electrode and the object to be processed are flat plates facing each other.

32. The plasma processing method according to claim 23, wherein the cathode electrode has a length longer than the object to be processed.

33. The plasma processing method according to claim 23, wherein the member for reducing high frequency distribution has a length longer than the object to be processed.

* * * * *